US008075359B2

(12) United States Patent
Yamada et al.

(10) Patent No.: US 8,075,359 B2
(45) Date of Patent: Dec. 13, 2011

(54) PHOSPHORUS-DOPED DIAMOND FILM ALLOWING SIGNIFICANTLY REDUCED ELECTRON EMISSION VOLTAGE, METHOD FOR PRODUCING THE SAME, AND ELECTRON SOURCE USING THE SAME

(75) Inventors: Takatoshi Yamada, Ibaraki (JP); Shinichi Shikata, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 579 days.

(21) Appl. No.: 12/066,976

(22) PCT Filed: Aug. 28, 2006

(86) PCT No.: PCT/JP2006/316845
§ 371 (c)(1),
(2), (4) Date: Mar. 14, 2008

(87) PCT Pub. No.: WO2007/037087
PCT Pub. Date: Apr. 5, 2007

(65) Prior Publication Data
US 2009/0167139 A1    Jul. 2, 2009

(30) Foreign Application Priority Data
Sep. 28, 2005  (JP) .................................. 2005-282977

(51) Int. Cl.
*H01J 9/04* (2006.01)
*H01J 9/12* (2006.01)
(52) U.S. Cl. .......... 445/51; 313/309; 313/336; 313/351; 313/346 R; 445/24; 445/46

(58) Field of Classification Search .......... 313/309–311, 313/336, 351, 346 R; 445/24–25, 46, 49–51
See application file for complete search history.

(56) References Cited

U.S. PATENT DOCUMENTS

| 2005/0168122 A1* | 8/2005 | Dahl et al. ................ 313/311 |
| 2005/0181131 A1* | 8/2005 | Linares et al. ............ 427/249.8 |
| 2005/0202665 A1* | 9/2005 | Namba et al. ............ 438/607 |

FOREIGN PATENT DOCUMENTS

| JP | 9 320450 | 12/1997 |
| JP | 2002 15658 | 1/2002 |
| JP | 2003 31109 | 1/2003 |
| JP | 2005 85785 | 3/2005 |
| JP | 2005085785 A * | 3/2005 |
| WO | 2004 079910 | 9/2004 |
| WO | 2004 088703 | 10/2004 |

* cited by examiner

*Primary Examiner* — Toan Ton
*Assistant Examiner* — Kevin Quarterman
(74) *Attorney, Agent, or Firm* — Oblon, Spivak, McClelland, Maier & Neustadt, L.L.P.

(57) ABSTRACT

A phosphorus-doped diamond film, which contains phosphorus at a concentration of $10^{15}$ cm$^{-3}$ or more, has a resistivity of $10^7$ Ωcm or less, and allows the voltage for initiation of electron emission to be 30V or less. A method for producing the phosphorus-doped diamond film by growing a diamond film on a diamond substrate by chemical vapor deposition method in an atmosphere containing methane and hydrogen gases and phosphorus with the use of tertiary butyl phosphorus as a source of addition of phosphorus. A diamond electron source having an electrode and a substrate which contains the phosphorous-doped diamond film and emitting electron beams from the phosphorous-doped diamond film when voltage is applied between the electrode and the substrate.

6 Claims, 5 Drawing Sheets

PHOSPHORUS-DOPED DIAMOND FILM ALLOWING SIGNIFICANTLY REDUCED ELECTRON EMISSION VOLTAGE, METHOD FOR PRODUCING THE SAME, AND ELECTRON SOURCE USING THE SAME

TECHNICAL FIELD

The present invention relates to a phosphorus-doped diamond film allowing a significantly reduced electron emission voltage, a method for producing the same, and an electron source using the same. A diamond electron source having a carbon-terminated structure can be used as an electron-beam-generating apparatus in fields involving various industrial instruments, household electrical appliances, and the like, such as flat panel displays, discharge tubes, lamps, excitation sources for X-rays or ultraviolet rays, and vacuum micro/nano devices.

With the phosphorus-doped diamond electron source according to the present invention, miniaturization and lower power consumption can be realized. In addition, such diamond electron source is an alternative to existing electron emission sources. Furthermore, development of such diamond electron source in new industrial fields is expected.

BACKGROUND ART

Various cold cathodes have been developed through microfabrication technology or thin-film formation technology. Applications of such cold cathodes for electron-beam-generating apparatuses including flat panel displays, discharge tubes, lamps, vacuum micro/nano devices, and the like has been studied. The realization of electronic devices, electronic instruments, and the like using properties of the cold cathodes has been expected. The realization of electronic devices, electronic instruments, and the like is difficult by using solid semiconductor devices. Obtainment of a high current with low voltage is essential for the realization of such application. Accordingly, the applications of cold cathodes have been studied and developed from both material and structural viewpoints.

From the material viewpoint, materials with low work functions are promising, so that oxides such as zirconium oxide, nitrides such as titanium nitride and aluminum nitride, and carbon-based materials such as diamonds and diamond-like carbon are subjects of search and development. Meanwhile, formation of a sharp-pointed needle or a cone-shape structure is required for a cold cathode material such as conventionally known molybdenum or tungsten in order to efficiently obtain a high current with low voltage. Production with the use of nanotechnology that has recently remarkably progressed is also employed.

Diamond has a band gap that is as wide as 5.5 eV. However, the electron affinity on the surface is negative. Thus, diamond has been suggested as a good cold cathode material (see Patent Document 1). Furthermore, aluminum nitride and boron nitride (which also have negative electron affinity) are similarly expected to be good cold cathode materials (see Patent Document 2). Among these materials having such negative electron affinity, diamond is the most likely candidate, since diamond is excellent in terms of material synthesis and controllability, and because nanoprocessing technology for diamond has also been developed (see Patent Document 3). Also in terms of other physical properties including a high degree of hardness, thermal conductivity, and chemical stability, diamond is the best candidate as an electron emission material since diamond is a covalently-bound monoatomic material.

The negative electron affinity of diamond appears when a diamond surface is terminated with hydrogen, titanium, nickel, or the like. It has been reported that electron emission is observed with voltage lower than that of conventional metals or semiconductor materials through the use of such surface (see Non-Patent Document 1). To maximize the features of such surface, there is a need to excite or inject electrons into a conduction band. Operation with low voltage is confirmed through addition of nitrogen or phosphorus, which is an impurity as a donor at a high concentration (see Non-Patent Document 2). However, electron emission that had actually elicited the feature of negative electron affinity was observed when the surface was coated with caesium (see Non-Patent Document 3). The use of caesium, which is handled with difficulty in industrial applications, is also problematic from an environmental viewpoint. Caesium also has high reactivity, so that the long-term stability thereof cannot be realized. Furthermore, negative electron affinity is also observed on a hydrogen-terminated surface. Specifically, the termination structure is stable in the air; however, it requires operation in an ultrahigh vacuum or hydrogen atmosphere from the viewpoint of stability of electron beam source operation. Such hydrogen-terminated surface has excellent basic characteristics, but is still problematic in terms of device operation.

It has been reported that greater voltage reduction was achieved on the stable surface structure of oxygen-terminated diamond by adding an impurity serving as a donor or an impurity that exerts an n-type electrical conducting property to diamond, compared with the case of a hydrogen-terminated surface having negative electron affinity (see Non-Patent Document 2).

The present inventors have revealed that a carbon-terminated structure obtained by treating a diamond surface with high-temperature heat treatment is stable, like a re-constructed surface, as a structure capable of realizing the excellent physical properties and surface stability of diamond and exerting excellent electron emission characteristics. The present inventors have also revealed that electron emission characteristics are observed at voltages lower than in the case of a hydrogen-terminated surface having negative electron affinity (Patent Document 4). Accordingly, significant reduction in operating voltage has been achieved. However, it is desired that further voltage reduction be achieved upon operation in practice.

Patent Document 1: JP Patent Publication (Kokai) No. 2002-15658 A
Patent Document 2: JP Patent Publication (Kokai) No. 2002-352694 A
Patent Document 3: JP Patent Publication (Kokai) No. 10-312735 A (1998)
Patent Document 4: JP Patent Application No. 2005-188963
Non-Patent Document 1: P. K. Baumann et al., Surface Science 409 (1998) 320.
Non-Patent Document 2: K. Okano et al, Nature 381 (1996) 140.
Non-Patent Document 3: M. W. Geis et al, Applied Physics Letters 67 (1995) 1328.

DISCLOSURE OF THE INVENTION

Problems to be Solved by the Invention

Conventional materials are problematic in that operating voltage is high, sufficient emission current is impossible to obtain compared with the case of hot cathodes, and current is unstable. Even diamond, which is particularly highly desirable because of its negative electron affinity, is problematic in that it is unsuitable for obtainment of larger currents. This is because diamond requires tip sharpening, even when the operating voltage is reduced. Further, voltage reduction has been attempted by adding an impurity serving as a donor, such as phosphorus, at high concentrations so as to increase electron concentration. However, voltage reduction at a practical application level has not been achieved, and a further almost double-digit decrease in voltage is required. In addition, it was found that significant reduction in operating voltage can be achieved when a surface structure is subjected to high-temperature heat treatment so as to obtain a carbon terminal. However, further reduction in operating voltage has been awaited.

According to the present invention, a method for producing phosphorus-doped diamond with which initiation of electron emission at a voltage significantly lower than that achieved with conventional diamond can be achieved and an electron source using such diamond have been achieved through the examination of a phosphorus impurity source and the designation of tertiary butyl phosphorus as an impurity source.

Means to Solve the Problems

The present inventors have conducted concentrated studies concerning these problems and have examined phosphorous as an impurity source so as to suggest a method for producing phosphorus-doped diamond with the use of tertiary butyl phosphorus as an impurity source and an electron source using such diamond.

Specifically, regarding production of a diamond cold cathode that is operable with low voltage, such electron source is an electron source using phosphorus-doped diamond synthesized with the use of an impurity source that differs from conventional impurities, whereby significant reduction in electron emission voltage can be achieved.

The present invention relates to a phosphorus-doped diamond film allowing a significantly reduced electron emission voltage, a method for producing the same, and an electron source using the same. According to the present invention, such electron source has a structure composed of an electrode and a diamond film, has a resistivity of diamond film of $10^7$ $\Omega$cm or less, and emits electrons or electron beams at a voltage for initiation of electron emission of 30 V or less when voltage is applied to the electrode. The present invention also relates to a method for producing phosphorus-doped diamond to which phosphorus has been added at a concentration of $10^{16}$ cm$^{-3}$ or more, and preferably $10^{18}$ cm$^{-3}$ or more and an electron source using the same.

That is, according to the present invention, a diamond film is characterized in that it contains phosphorus at a concentration of $10^{16}$ cm$^{-3}$ or more ($10^{18}$ cm$^{-3}$ or more), has a resistivity of $10^7$ $\Omega$cm or less, and allows the voltage for initiation of electron emission to be 30 V or less.

In addition, according to the present invention, diamond having a diamond film surface that is partially or entirely terminated with oxygen, carbon, or hydrogen can be obtained.

Further, according to the present invention, a diamond film can be a single crystal film having a (111)-, (100)-, or (110)-oriented crystal structure or a polycrystalline film.

Furthermore, the present invention relates to a method for producing a phosphorus-doped diamond film, comprising growing a diamond film on a diamond substrate by a microwave CVD method in an atmosphere containing gases (methane and hydrogen) and phosphorus with the use of tertiary butyl phosphorus as a source of addition of phosphorous, such diamond film containing phosphorus at a concentration of $10^{16}$ cm$^{-3}$ or more ($10^{18}$ cm$^{-3}$ or more), having a resistivity of $10^7$ $\Omega$cm or less, and allowing the voltage for initiation of electron emission to be 30 V or less.

Furthermore, according to the present invention, diamond can be synthesized by a microwave CVD method.

Furthermore, according to the present invention, a diamond film can be grown at a methane/hydrogen ratio of 0.0002:1 to 0.01:1 and a tertiary butyl phosphorus/methane ratio of 300 ppm to 10000 ppm.

Furthermore, according to the present invention, a single crystal substrate having a (111)-, (100)-, or (110)-oriented crystal structure or a polycrystalline substrate can be used as a diamond substrate.

Furthermore, the present invention relates to a diamond electron source having an electrode and a substrate comprising a diamond film and emitting electron beams from the diamond film when voltage is applied between the electrode and the substrate. Such electron source is characterized in that the diamond film contains phosphorus at a concentration of $10^{16}$ cm$^{-3}$ or more, ($10^{18}$ cm$^3$ or more), has a resistivity of $10^7$ $\Omega$cm or less, and allows the voltage for initiation of electron emission to be 30 V or less.

Furthermore, according to the present invention, diamond having the diamond film surface that is partially or entirely terminated with oxygen, carbon, or hydrogen can be obtained.

Furthermore, according to the present invention, a semiconductor or a metal can be used as a substrate for an electron source.

Furthermore, according to the present invention, diamond film that is single crystal film having a (111)-, (100)-, or (110)-oriented crystal structure or a polycrystalline film can be used.

EFFECT OF THE INVENTION

The phosphorus-doped diamond film of the present invention contains phosphorus at a concentration $10^{16}$ cm$^{-3}$ or more ($10^{18}$ cm$^{-3}$ or more) and has a resistivity of $10^7$ $\Omega$cm or less. It allows the voltage for initiation of electron emission to be 30 V or less when it is used as an electron source.

Further, with the phosphorus-doped diamond film of the present invention, a high current can be obtained with low voltage in an actual cold cathode operation. Therefore, according to the present invention, lower power consumption, miniaturization, and higher energy efficiency can be realized for conventional electronic instruments using electron beams.

Moreover, the present invention can also be applied to environmentally-resistant electronic devices, although the application to the same is difficult to realize by using solid semiconductor devices. Accordingly, such diamond film of the present invention can be a means for addressing future energy problems. The diamond film of the present invention is extremely effective industrially for use in electron-beam-generating apparatuses in fields involving various industrial instruments and household electrical appliances such as flat panel displays, discharge tubes, lamps, and vacuum micro/nano devices.

BEST MODE FOR CARRYING OUT THE INVENTION

Figure 1:
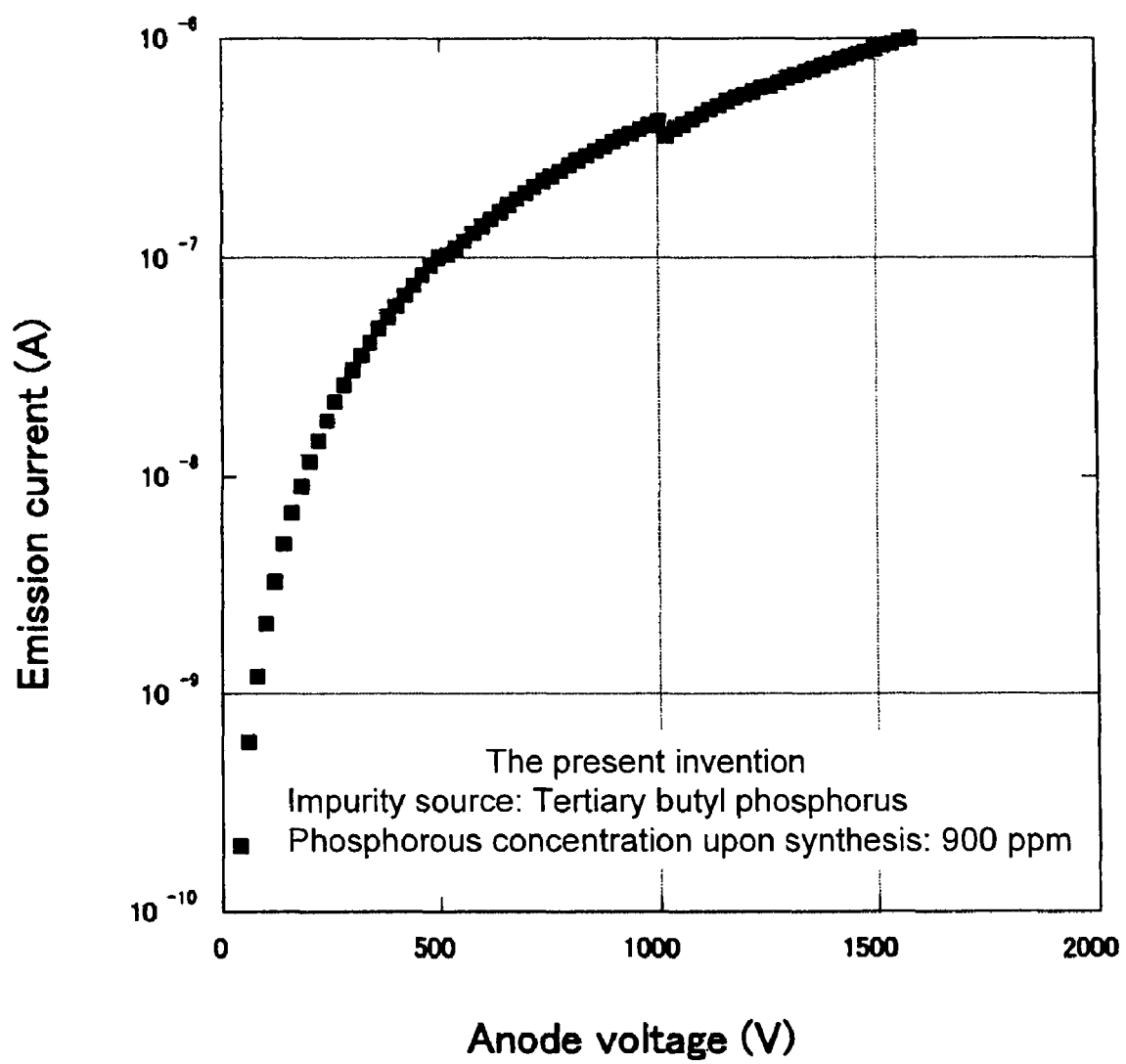
FIG. 1 is a characteristic graph of the present invention.
Figure 2:
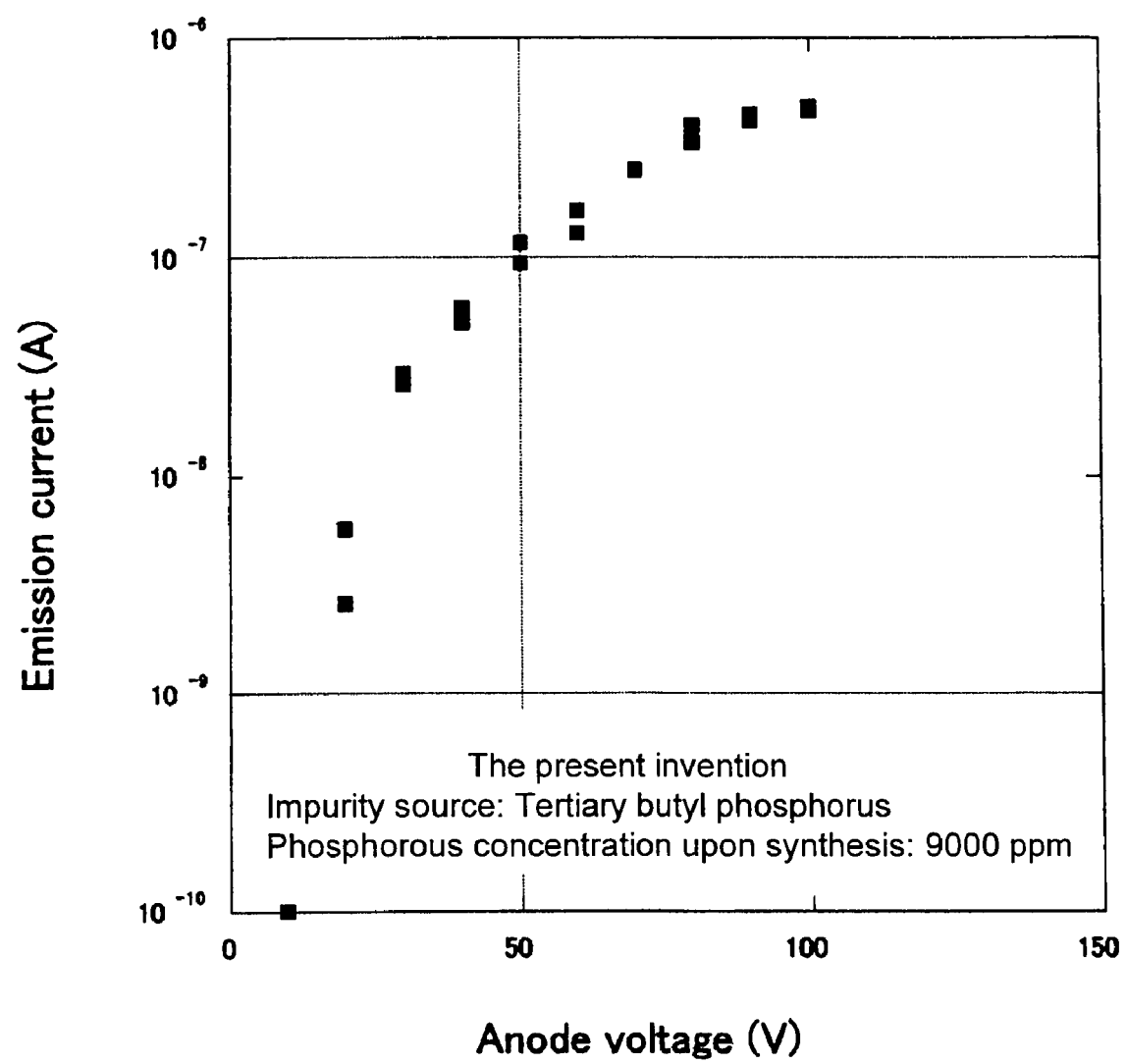
FIG. 2 is a characteristic graph of the present invention.

In order to fully utilize the characteristics of phosphorus-doped diamond, it is necessary for such diamond to be formed with a stable surface structure. In view of practical operation environments, an oxygen-terminated structure is preferable. Alternatively, a carbon-terminated structure and a carbon re-constructed surface are also preferable.

The phosphorus-doped diamond used for the present invention is synthesized by a CVD method or obtained by a high-temperature high-pressure method. Diamond obtained by either one of the above methods contains phosphorus added thereto at a concentration of preferably $10^{16}$ cm$^{-3}$ or more and more preferably $10^{18}$ cm$^{-3}$ or more.

A high-concentration phosphorus-doped homoepitaxial diamond thin film synthesized with the use of tertiary butyl phosphorus as a source of addition of phosphorus according to the present invention is mainly characterized in that it contains phosphorus at a concentration of $10^{16}$ cm$^{-3}$ or more ($10^{18}$ cm$^{-3}$ or more) and in that the voltage for initiation of electron emission is approximately 20 V to 30 V or less, which is equivalent to 1/30 of such voltage for a high-concentration phosphorus-doped homoepitaxial diamond thin film synthesized with a conventional source of addition of phosphorus when voltage is applied between an electrode and a substrate in an electron source having an electrode and a substrate comprising a diamond film.

A typical example of the phosphorus-doped diamond film allowing a significantly reduced electron emission voltage of the present invention is a phosphorus-doped homoepitaxial diamond thin film (111) containing tertiary butyl phosphorus as an impurity source and having an electron concentration of $10^{15}$ cm$^{-3}$ or more. Such film exhibits a resistivity of $10^{7}$ Ωcm or less at room temperature.

According to the present invention, a stable diamond surface is a surface that is partially or entirely terminated with oxygen, hydrogen, or carbon, a re-constructed surface, or a composite surface thereof. However, in view of practical operation environments, a surface that is partially or entirely terminated with oxygen is preferable. Moreover, crystal plane orientation is not limited to (111), and a crystal plane orientation such as (100)- or (110)-orientation can be used. A polycrystalline film can also be used.

EXAMPLE 1

A phosphorus-doped homoepitaxial diamond thin film (111) was synthesized so that the concentration of phosphorus was 900 ppm with respect to carbon within a reaction tank upon synthesis, and the same was then used as a sample. The diamond film was synthesized by a microwave CVD method in an atmosphere of gases (methane and hydrogen) using tertiary butyl phosphorus as a source of addition of phosphorus. Synthesis conditions employed herein consisted of a methane/hydrogen ratio of 0.0005:1 and a tertiary butyl phosphorus/methane ratio of 900 ppm. Ib(111) synthesized via high temperature and high pressure was used as a substrate.

The diamond film used herein exerted, as electrical characteristics, an n-type electrical conducting property as confirmed by Hall effect measurement, and it had an electron concentration of the order of $10^{15}$ cm$^{-3}$ and a resistivity of the order of $10^{5}$ Ωcm at room temperature.

An oxygen-terminated structure was obtained by chemical solution treatment involving boiling of diamond in a solution prepared by mixing nitric acid with sulfuric acid at 1:3 under conditions consisting of a temperature of 220° C. for 60 minutes, followed by boiling with ultrapure water for 10 minutes or more.

Electron emission characteristics were measured in a vacuum of $1 \times 10^{-9}$ Torr. Each sample was fixed on a ground electrode and then hemispherically-processed tungsten having a diameter of 20 μm was used as an anode. The distance between the anode and the diamond surface was determined to be 50 μm. The voltage of the anode electrode was increased and the thus observed emission current was measured. The voltage for initiation of electron emission was found to be significantly reduced to approximately 20 V (FIG. 1).

EXAMPLE 2

A phosphorus-doped homoepitaxial diamond thin film (111) was synthesized so that the concentration of phosphorus was 9000 ppm with respect to carbon within a reaction tank upon synthesis, and the same was then used as a sample. The diamond film was synthesized by a microwave CVD method in an atmosphere of gases (methane and hydrogen) using tertiary butyl phosphorus as a source of addition of phosphorus. Synthesis conditions employed herein consisted of a methane/hydrogen ratio of 0.0005:1 and a tertiary butyl phosphorus/methane ratio of 9000 ppm. Ib(111) synthesized via high temperature and high pressure was used as a substrate.

The diamond film used herein exerted, as electrical characteristics, an n-type electrical conducting property as confirmed by Hall effect measurement, and it had an electron concentration of the order of $10^{18}$ cm$^{-3}$ and a resistivity of the order of $10^{2}$ Ωcm at room temperature.

An oxygen-terminated structure was obtained by chemical solution treatment involving boiling of diamond in a solution prepared by mixing nitric acid with sulfuric acid at 1:3 under conditions consisting of a temperature of 220° C. for 60 minutes, followed by boiling with ultrapure water for 10 minutes or more.

Electron emission characteristics were measured in a vacuum of $1 \times 10^{-9}$ Torr. Each sample was fixed on a ground electrode and then hemispherically-processed tungsten having a diameter of 20 μm was used as an anode. The distance between the anode and the diamond surface was determined to be 50 μm. The voltage of the anode electrode was increased and the thus observed emission current was measured. The voltage for initiation of electron emission was found to be significantly reduced to approximately 20 V (FIG. 1).

In these Examples, electron emission initiation voltage significantly lower than that achieved by conventional technology using negative electron affinity or nanotechnology, as in the following Comparative examples, could be realized.

COMPARATIVE EXAMPLE 1

The phosphorus-doped diamond of the present invention was compared with high-concentration phosphorus-doped diamond synthesized by conventional technology with the use of phosphine as a typical phosphorus impurity source.

A high-concentration phosphorus-doped homoepitaxial diamond thin film (111) was synthesized so that the concentration of phosphorus was 0.9% to 1% with respect to carbon within a reaction tank upon synthesis, and the same was then used for synthesis of high-concentration phosphorus-doped diamond comprising phosphine as an impurity source.

An oxygen-terminated structure was obtained by chemical solution treatment involving boiling of diamond in a solution prepared by mixing nitric acid with sulfuric acid at 1:3 under conditions consisting of a temperature of 220° C. for 60 minutes, followed by boiling with ultrapure water for 10 minutes or more.

Electron emission characteristics were measured in a vacuum of $1\times10^{-9}$ Torr. Each sample was fixed on a ground electrode and then hemispherically-processed tungsten having a diameter of 20 μm was used as an anode. The distance between the anode and the diamond surface was determined to be 50 μm. The voltage of the anode electrode was increased and the thus observed emission current was measured.

Figure 3:
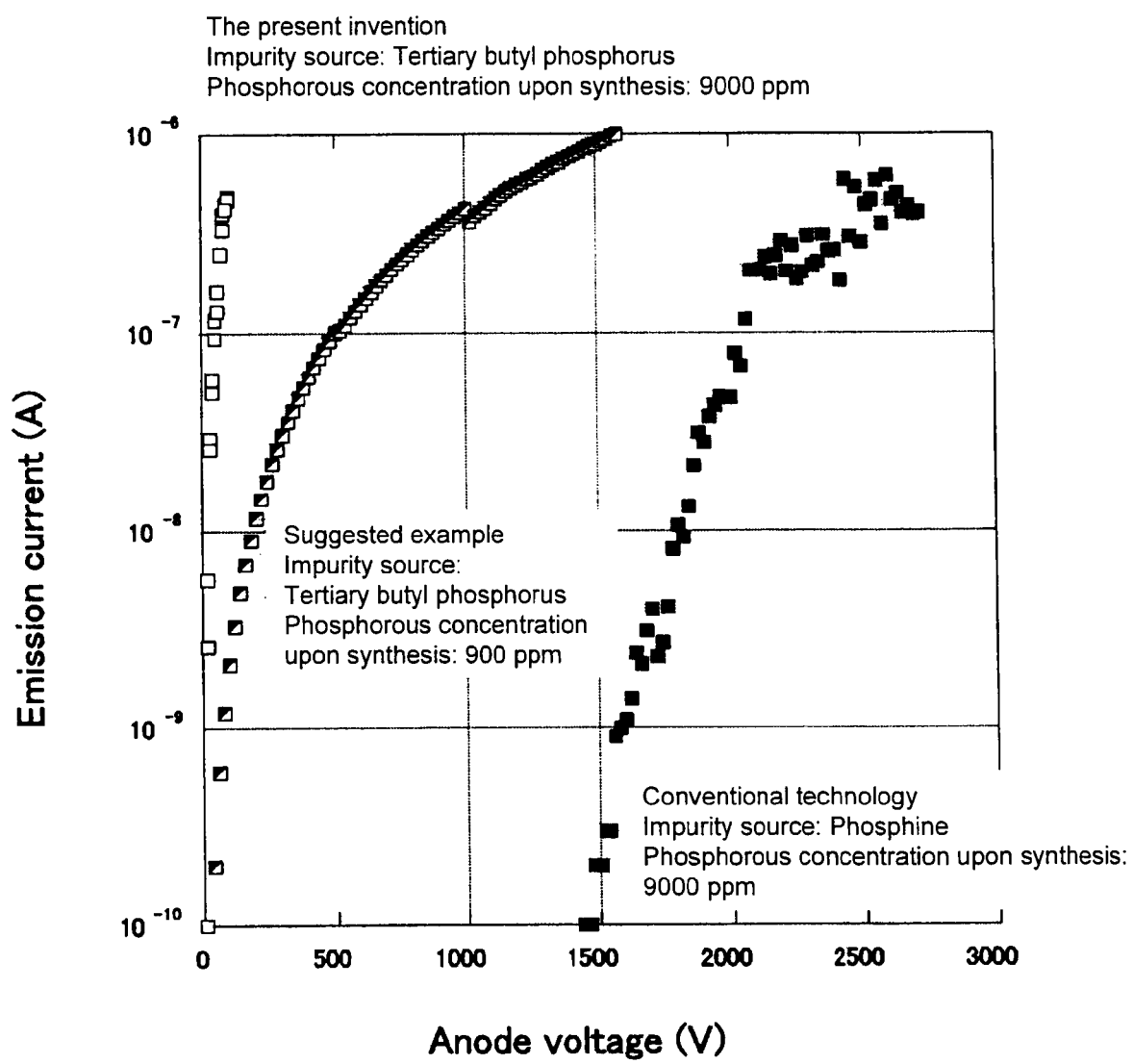
FIG. 3 is a characteristic graph for comparison with a conventional example.

It is obvious that electron emission characteristics in the case of the high-concentration phosphorus-doped homoepitaxial diamond thin film obtained in Example 2 were significantly reduced to approximately 1/30 of those in the case of the high-concentration phosphorus-doped homoepitaxial diamond thin film obtained by conventional technology in Comparative example 1 (1450 V) (FIG. 3).

COMPARATIVE EXAMPLE 2

Figure 4:
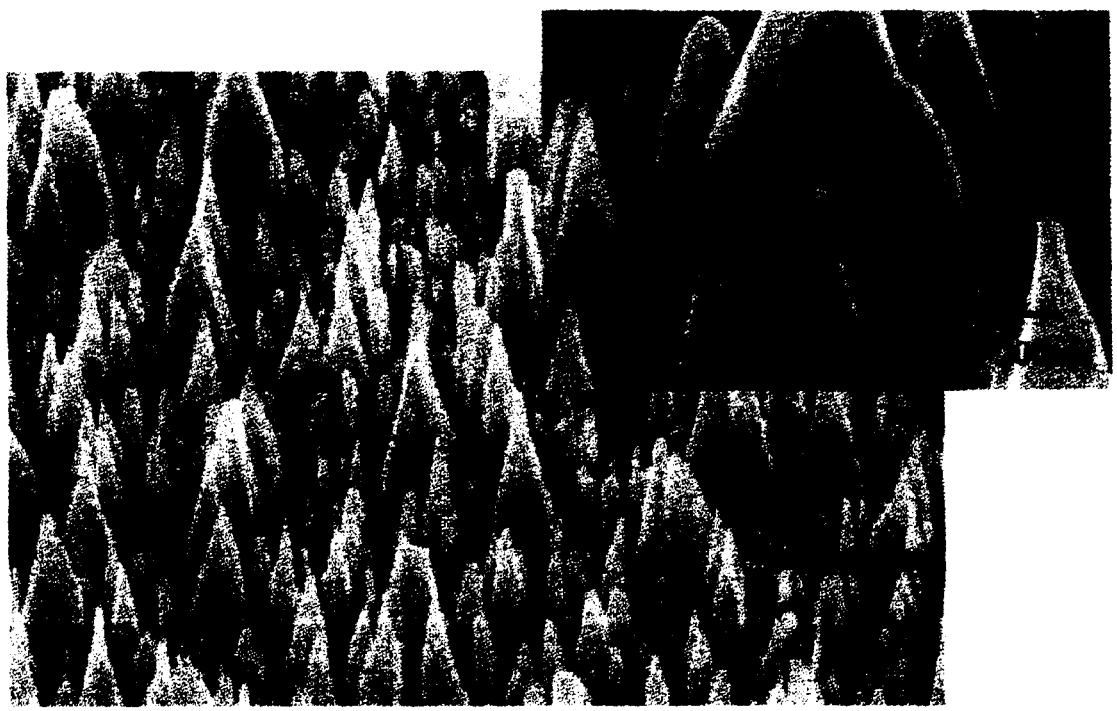
FIG. 4 shows a diamond whisker nanochip array produced according to conventional technology.

It is known that the p-type semiconductor diamond surface has low electron emission initiation voltage, as in reported examples of electron emission from diamond. Furthermore, the surface of the present invention was compared with the hydrogen-terminated structure of a p-type diamond semiconductor whisker nanochip array that exerts excellent properties from material and structural viewpoints through formation of a nanostructure, as in the case of a conventional silicon or metal cold cathode (FIG. 4).

The nanostructure was formed by plasma etching and the hydrogen-terminated structure was formed using a hot filament CVD apparatus for diamond synthesis. Representative conditions consisted of filament temperature of 2100° C., substrate temperature of 800° C., hydrogen atmosphere pressure of 100 Torr, and a time of 10 minutes.

Electron emission characteristics were measured in a vacuum of $1\times10^{-9}$ Torr. Each sample was fixed on a ground electrode and then hemispherically-processed tungsten having a diameter of 20 μm was used as an anode. Distance between the anode and the diamond surface was determined to be 50 μm. The voltage of the anode electrode was increased and the thus observed emission current was measured.

Figure 5:
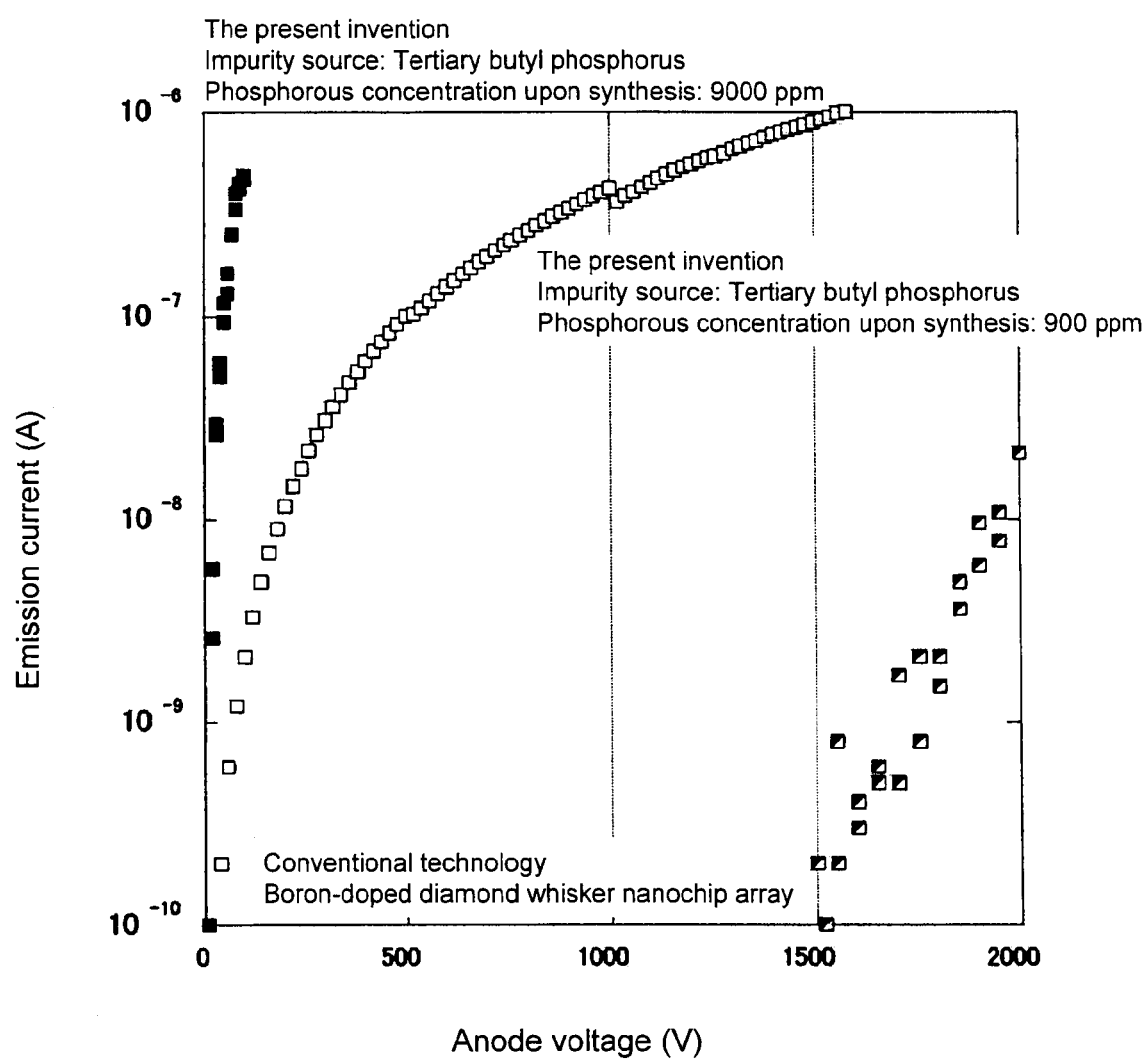
FIG. 5 is a characteristic graph for comparison with a conventional example.

It is obvious that electron emission characteristics in the case of the high-concentration phosphorus-doped homoepitaxial diamond thin film obtained in Example 2 were significantly reduced to approximately 1/30 of those in the case of the diamond whisker nanochip array obtained by conventional technology in Comparative example 2 (1500 V) (FIG. 5).

INDUSTRIAL APPLICABILITY

The carbon-terminated structure obtained by the method of the present invention has a planar structure compared with the nanostructure diamond with which electron emission with low voltage has been realized. Hence, the carbon-terminated structure has a structure suitable for obtainment of larger currents. Moreover, voltage for initiation of electron emission in the case of the carbon-terminated structure is significantly lower than that in the case of a negative electron affinity surface. Accordingly, it is predicted that the carbon-terminated structure has a narrow angle of radiation of electron beams and a narrow energy width of emitted electrons. This means the carbon-terminated structure is excellent for use in displays such as field emission displays. Furthermore, the use of the carbon-terminated structure can be developed for use for analysis and evaluation apparatuses using electron beams, such as electron microscopes. Compared with conventional apparatuses, such analysis and evaluation apparatuses for which the carbon-terminated structure is applied have higher accuracy, so that novel development and discovery can be expected in terms of analyses and evaluation.

The invention claimed is:

1. A method for producing a phosphorus-doped diamond film, comprising growing only an n-type diamond film on a diamond substrate by chemical vapor deposition method in an atmosphere containing methane and hydrogen gases and phosphorus with the use of tertiary butyl phosphorus as a source of addition of phosphorous, such diamond film containing phosphorus at a concentration of $10^{15}$ cm$^{-3}$ or more, having a resistivity of $10^7$ Ωcm or less, and allowing the voltage for initiation of electron emission to be 30 V or less.

2. The method for producing a phosphorus-doped diamond film according to claim 1, wherein diamond is synthesized by a microwave chemical vapor deposition method.

3. The method for producing a phosphorus-doped diamond film according to claim 1, wherein a diamond film is grown at a methane/hydrogen ratio of 0.0002:1 to 0.01:1 and a tertiary butyl phosphorus/methane ratio of 300 ppm to 10000 ppm.

4. The method for producing a phosphorus-doped diamond film according to claim 1, wherein the diamond substrate is a single crystal substrate having a (111)-, (100)-, or (110)-oriented crystal structure or a polycrystalline substrate.

5. The method for producing a phosphorus-doped diamond film according to claim 2, wherein a diamond film is grown at a methane/hydrogen ratio of 0.0002:1 to 0.01:1 and a tertiary butyl phosphorus/methane ratio of 300 ppm to 10000 ppm.

6. The method for producing a phosphorus-doped diamond film according to claim 2, wherein the diamond substrate is a single crystal substrate having a (111)-, (100)-, or (110)-oriented crystal structure or a polycrystalline substrate.

* * * * *